(12) United States Patent
Abbott

(10) Patent No.: US 8,044,495 B2
(45) Date of Patent: Oct. 25, 2011

(54) METALLIC LEADFRAMES HAVING LASER-TREATED SURFACES FOR IMPROVED ADHESION TO POLYMERIC COMPOUNDS

(75) Inventor: Donald C Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 12/489,238

(22) Filed: Jun. 22, 2009

(65) Prior Publication Data
US 2010/0320579 A1   Dec. 23, 2010

(51) Int. Cl.
*H01L 23/495* (2006.01)
*H01L 21/00* (2006.01)
*H01R 9/00* (2006.01)

(52) U.S. Cl. . 257/672; 257/674; 257/690; 257/E23.031; 257/E23.045; 361/772; 438/123

(58) Field of Classification Search ........................ None
See application file for complete search history.

(56) References Cited

U.S. PATENT DOCUMENTS

| | | | |
|---|---|---|---|
| 6,127,206 A * | 10/2000 | Nakamichi | 438/111 |
| 6,197,615 B1 * | 3/2001 | Song et al. | 438/111 |
| 6,670,222 B1 * | 12/2003 | Brodsky | 438/118 |
| 7,109,570 B2 * | 9/2006 | Manalac et al. | 257/666 |
| 7,262,491 B2 * | 8/2007 | Islam et al. | 257/670 |
| 2009/0230526 A1 * | 9/2009 | Chen et al. | 257/676 |

* cited by examiner

*Primary Examiner* — Alonzo Chambliss
(74) *Attorney, Agent, or Firm* — Yingsheng Tung; Wade J. Brady, III; Frederick J. Telecky, Jr.

(57) ABSTRACT

A leadframe for the assembly of a semiconductor chip has regions (112) with an original smooth surface of glossy appearance and regions (113, 114, 210) of a frosty appearance with rough surface contours. The regions of rough surface contours include two-dimensional arrays of spots (401) comprising a central area (402) below the original surface (400) and a piled ring (403) above the original surface. The piled ring (403) consists of the leadframe material in amorphous configuration.

15 Claims, 4 Drawing Sheets

METALLIC LEADFRAMES HAVING LASER-TREATED SURFACES FOR IMPROVED ADHESION TO POLYMERIC COMPOUNDS

FIELD OF THE INVENTION

The present invention is related in general to the field of semiconductor devices and processes, and more specifically to the structure and fabrication process of metallic leadframes in semiconductor packages having laser-treated surfaces for improved adhesion to the polymeric compounds of the package.

DESCRIPTION OF RELATED ART

In semiconductor devices, the chips are encapsulated in packages to protect the enclosed parts against mechanical damage and environmental influences, particularly against moisture and light, while providing trouble-free electrical connections. Based on their functions, the semiconductor packages include a variety of different materials; metals are employed for electrical and thermal conductance, and insulators, such as polymeric molding compounds, are used for encapsulations and form factors. To ensure the unity and coherence of the package, these different materials are expected to adhere to each other during the lifetime of the package while tolerating mechanical vibrations, temperature swings, and moisture variations.

Today' semiconductor technology employs a number of methods to raise the level of adhesion between the diversified materials so that the package passes accelerated tests and use conditions without delamination. As an example, the adhesion between copper-based leadframes and epoxy-based molding compounds and chip-attach compounds can be improved by adding design features such as indentations, grooves or protrusions to the leadframe surface. A widely used technique is the mechanical "dimpling" of the underside of the chip attach pad by producing patterns of indentations in the leadframe metal, sized between about 500 and 1000 µm. Another example to improve adhesion is the method to chemically modify the leadframe surface by oxidizing the metal surface, for instance creating copper oxide. Copper oxide is known to adhere well to epoxy-based molding compounds. Such modifications are typically performed in the factory of the leadframe supplier.

Another example of known technology to increase adhesion between leadframe, chip, and encapsulation compound in semiconductor packages, is the roughening of the whole leadframe surface by chemically etching the leadframe surface after stamping or etching the pattern from a metal sheet. Chemical etching is a subtractive process using an etchant. When, for some device types, the roughening of the metal has to be selective, protective masks have to be applied to restrict the chemical roughening to the selected leadframe areas. General etching and selective etching with mask steps are typically performed in the factory of the leadframe supplier using a proprietary roughening process, which depends on the metal, fabrication history and finish of the leadframe; the application of masks is material-intensive and thus expensive. Chemical etching creates a micro-crystalline metal surface with a roughness on the order of 1 µm or less.

Yet another known method to achieve a rough surface, performed in the factory of the leadframe supplier, is the use of a specialized nickel plating bath to deposit a rough nickel layer. This method is an additive process; it has to employ a protective photomask when the deposition has to be restricted to selected leadframe portions. The created surface roughness is on the order of 1 to 10 µm.

SUMMARY OF THE INVENTION

Applicant recognized that the market trend for semiconductor products, especially in automotive and medical applications, demands greatly increased insensitivity against moisture level exposure, in spite of shrinking component and package sizes. This trend implies an increased need for reliable adhesion between the different parts of a semiconductor product, including encapsulation, chip-attach compound, leadframe, and chip.

Applicant further recognized the shortcomings of the presently available leadframe roughening techniques. General roughening of the surface impacts wire bonding negatively, since vision systems have trouble seeing the roughened surface; the rough surface shortens capillary life; and micro-contaminants on the rough surface degrades bonding consistency. General rough surfaces tend to allow more bleeding, when the resin component separates from the bulk of the chip attach compound and spreads over the surface of the chip pad; the resin bleed, in turn, can degrade moisture level sensitivity and interfere with down bonds on the chip pad. Conventional correction of the resin bleed requires masking all or portions of the chip pad, an expensive process step.

Applicant saw that selective roughening of the leadframe surface using masks is too expensive in the competitive market environment. Because the areas of the leadframe, which require masking, are small, and the lead tips are coined (by using punching to selectively reduce the starting thickness of the leadframe base metal) and thus on a different plane than the top leadframe surface, the masking has to be performed with costly electrodeposited resists.

Applicant solved the problem of improving moisture level sensitivity of semiconductor devices by selective leadframe surface roughening at low cost, when he discovered that a computer-controlled laser can create selective rough regions on any portion and in any metal of a leadframe at any reasonable depth. The thermal energy of the focused laser creates spots comprising a central area below the original surface of the leadframe and a piled ring above the original surface, where the piles consist of amorphous leadframe metal. Being locked into the surface contours of the leadframe, the encapsulation cannot move sideways in spite of differences between the coefficient of thermal expansion of leadframe metal and encapsulation compound. Delamination of encapsulation and leadframe is inhibited. The technique is fast, low cost, can be performed at any phase of a semiconductor assembly process (for example before or after chip attach, before or after wire bonding), on any standard leadframe (eliminating logistic sourcing and separation of special high adhesion leadframe parts), and by any assembly site (even offshore). Roughened zones can be created on the top and, if desired, on the bottom surface of the inner lead fingers, and, if desired, on selected parts of the chip pad.

A preferred embodiment of the invention includes regions with a regular array of linear rows and lines of spots, which are preferably about 20 to 30 µm deep and are surrounded by piles of amorphous metal; the roughness is adjustable by tuning the laser parameters. Preferably, the pitch of the indentations is less than 50 µm center-to-center and the pitch of the rows is less than 50 µm centerline-to-centerline. Since the laser roughening technique is a dry process, there is no debris common to wet processes. The laser technique is fast: The roughening of a complicated pattern onto one leadframe can be completed by one laser in less than 1 second, the roughening of a leadframe strip in less than 30 seconds.

The laser-roughening method is applicable to any surface, including substrates made of an insulating compound integral with conductive traces and vias. In leadframes with plated metal layers, such as nickel and palladium, on a base metal such as copper, the laser-created spots may be deep enough to remove the plated layers and expose the base metal.

DETAILED DESCRIPTION OF THE PREFERRED EMBODIMENTS

Figure 1:
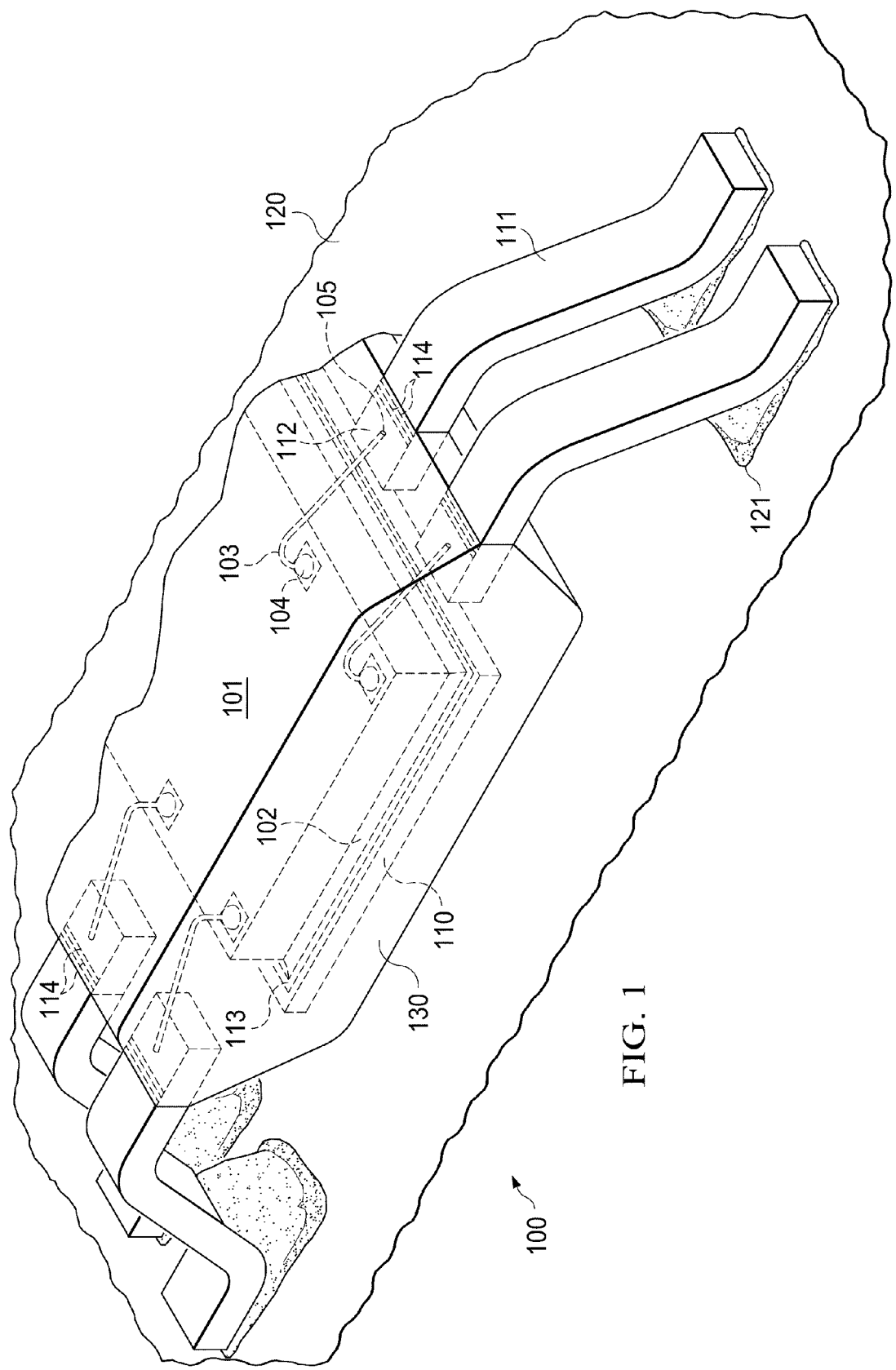
FIG. 1 is a schematic perspective X-ray view of a portion of an electronic device with a semiconductor chip assembled on a metallic leadframe and encapsulated by a polymer compound. The features of the dotted surface areas of the leadframe are addressed by the invention.

FIG. 1 depicts a perspective X-ray of a portion of a semiconductor device 100 assembled by solder 121 on a board 120. The device includes a semiconductor chip 101 attached with an adhesive film 102 onto the chip pad 110 of a metallic leadframe. The lead segments 111 of the leadframe enable the solder attachment to the board. Chip 101 is electrically connected by bonding wires 103 to the lead segments 111; on one end of the metal wires are the wire balls 104, and on the other end the wire stitches 105. The chip 101, the bonding wires 103 and the chip pad 110 are encapsulated in a package 130 made of a polymer compound. Included in the package are the end portions 112 of segments 111, which carry the wire stitches 105.

In the preferred embodiment of the invention, package 130 is created by a molding process, wherein a polymer compound (preferably based on an epoxy formulation and filled with inorganic granules) is molded around the assembled chip and leadframe portions. In this process, the leadframe with the attached and bonded chip is placed in the cavity of a steel mold. The heated and viscous compound is pressured into the cavity to fill the cavity and surround the chip and leadframe portions without voids. After polymerizing the compound and cooling to ambient temperature, the mold is opened, while the compound remains adhering to the molded parts. For the finished packaged device, the molding compound and the assembled parts are expected to retain reliable adhesion through all tests and operations of the device so that any form of delamination is prevented.

The reliability of the adhesion between the encapsulating compound and the encapsulated parts depends on the integrity in time and temperature of the interfaces between the compound and the parts. In first order, the interfaces have to guarantee mechanical interlocking of compound and parts strong enough so that different physical expansions and contractions in x- and y-directions based on different coefficients of thermal expansion can be prevented from disrupting the interlocking. With movements in x- and y-directions suppressed, movements in the z-direction (i.e., delamination) can also be inhibited. Volumetric expansion and contraction does not endanger the reliable coherence of the encapsulation compound and the encapsulated parts, especially the encapsulated portions of the leadframe.

FIG. 1 highlights by shading certain areas of the leadframe, especially areas 113 of the chip pad 110 and areas 114 of the lead segments 112. These areas as well as other areas of the leadframe are discussed in more detail in the top photographs FIGS. 2 to 5 of a leadframe, which has component parts analogous to the schematic leadframe shown in FIG. 1.

Figure 2:
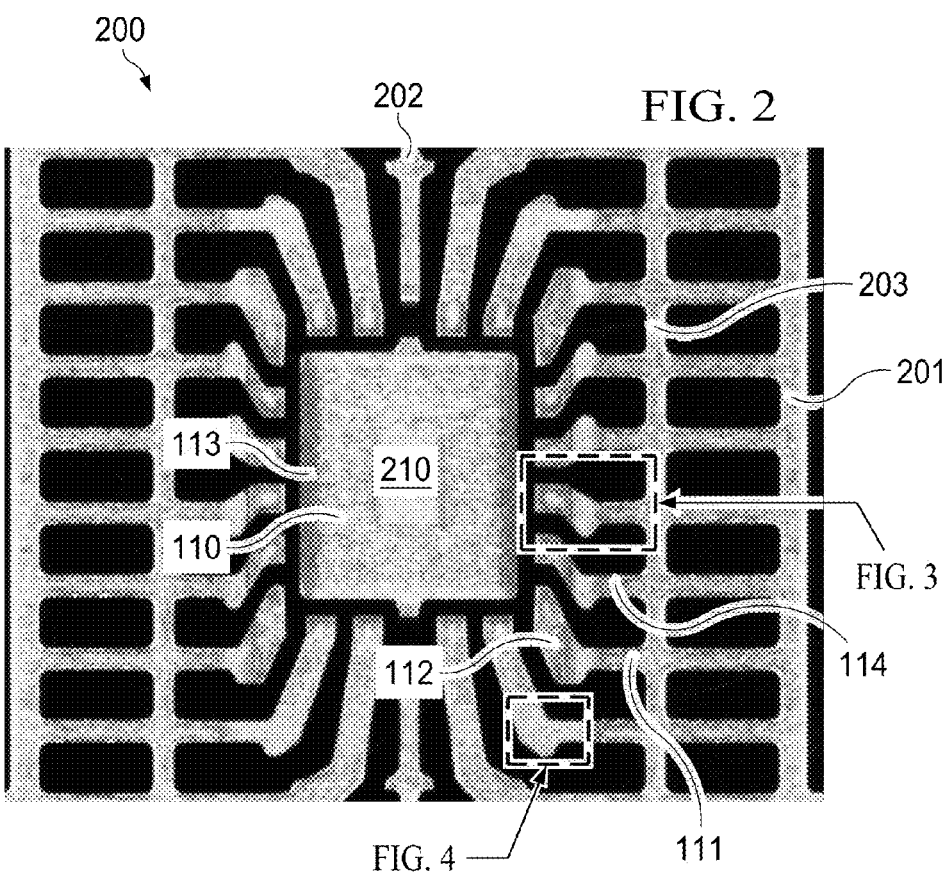
FIG. 2 shows an enlarged top view of the metallic leadframe as a piece part before being used in the assembly of semiconductor devices. The highlighted areas are addressed by the invention.

FIG. 2 illustrates a portion of a leadframe, generally designated 200, before the leadframe is used in the assembly a semiconductor chip and then in the enclosure of the assembly in a polymer package. Leadframe portion 200 includes a portion of the frame 201, the chip pad 110 with area 113 corresponding to the shaded area of FIG. 1, the pad straps 202 (the connection of straps 202 to frame 201 is not shown in FIG. 2), a plurality of lead segments 111 with end portions 112 and areas 114 corresponding to the shaded areas of FIG. 1, and the dam bar 203. Leadframe portion 200 is photographed so that areas 113 and 114, which correspond to the shaded areas in FIG. 1, appear brighter than the remainder of the leadframe; another brighter area 210 is located in the center of the chip pad 110. The origin of the different light reflection is explained in FIGS. 3 and 4, which are enlargements of the fragmentary portions marked in FIG. 2.

The metal of leadframe 200 includes copper as the base metal covered by a layer of nickel (thickness between about 0.5 and 2.0 µm) and an outermost layer of palladium (thickness 0.1 µm or less) and gold (thickness 0.009 µm or less).

Figure 3:
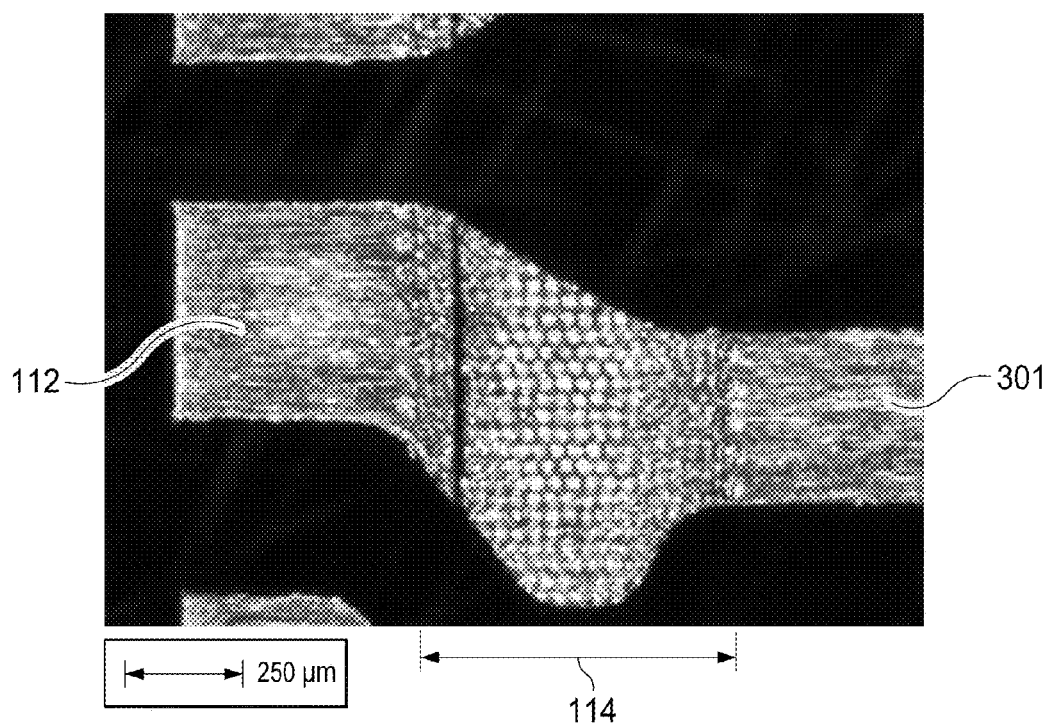
FIG. 3 is a top view illustrating a fragmentary enlarged portion of the leadframe of FIG. 2, showing the two-dimensional array of surface spots created by the invention.

The fragmentary leadframe portion illustrated in FIG. 3 shows the original smooth metallic surface of the leadframe in the region of end portion 112 and the region designated 301. These original smooth surface regions have a glossy appearance. In contrast, the region 114 shows a two-dimensional array of spots aligned in rows. According to the scale indicated, the spots have a diameter of about 20 to 30 µm. The pitch of the spots is less than 50 µm center-to-center, and the pitch of the rows is less than 50 µm centerline-to-centerline. The spots reflect the light differently and thus give the region a frosty appearance.

Figure 4:
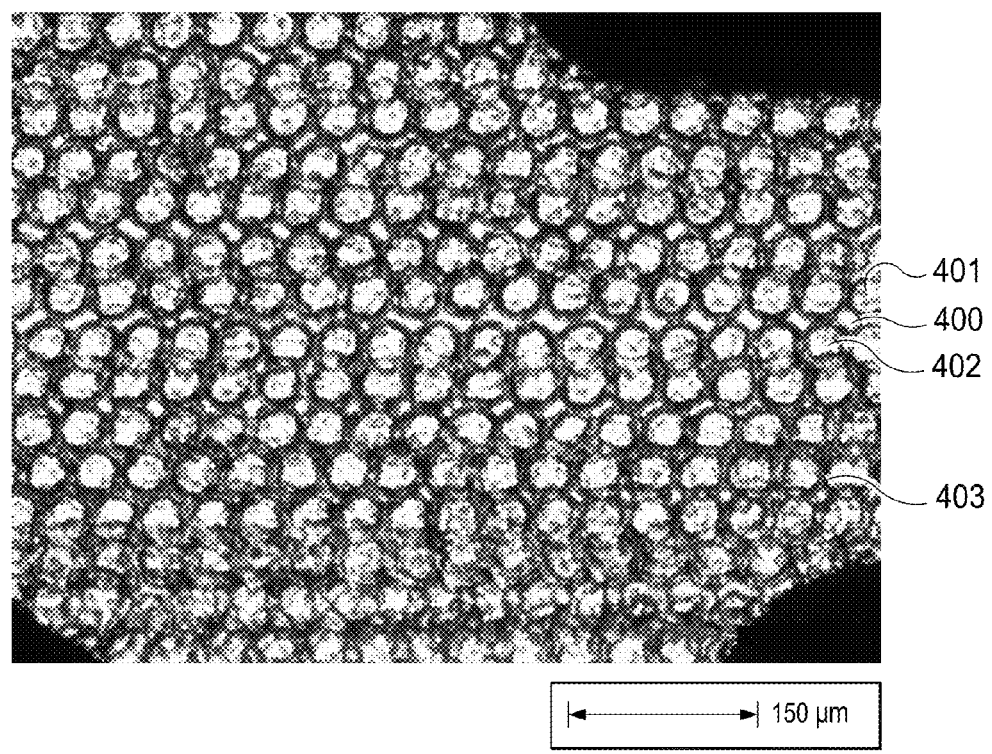
FIG. 4 is a top view showing another fragmentary enlarged portion of the leadframe of FIG. 2.

The linear dimensions of the array of spots are corroborated in the enlargement of FIG. 4, which depicts another portion of FIG. 2 to show the array of spots at higher magnification. As FIG. 4 illustrates, each spot 401 comprises a central area 402 below the original surface 400 and a piled ring 403 above the original surface 400. A metallurgical analysis has determined that the piled rings 403 consist of the metals of the leadframe surface in amorphous configuration. In the example of copper leadframes with surface layers of nickel and palladium, the piles include amorphous nickel and palladium; when the central area reaches through the surface metal layers, the piles also include amorphous copper from the base metal of the leadframe. In the example of FIG. 4, the rows formed by the spots are substantially parallel to each other; in some locations, the spots of adjacent rows are staggered against each other. In other examples, the spots may be more random.

Figure 5:
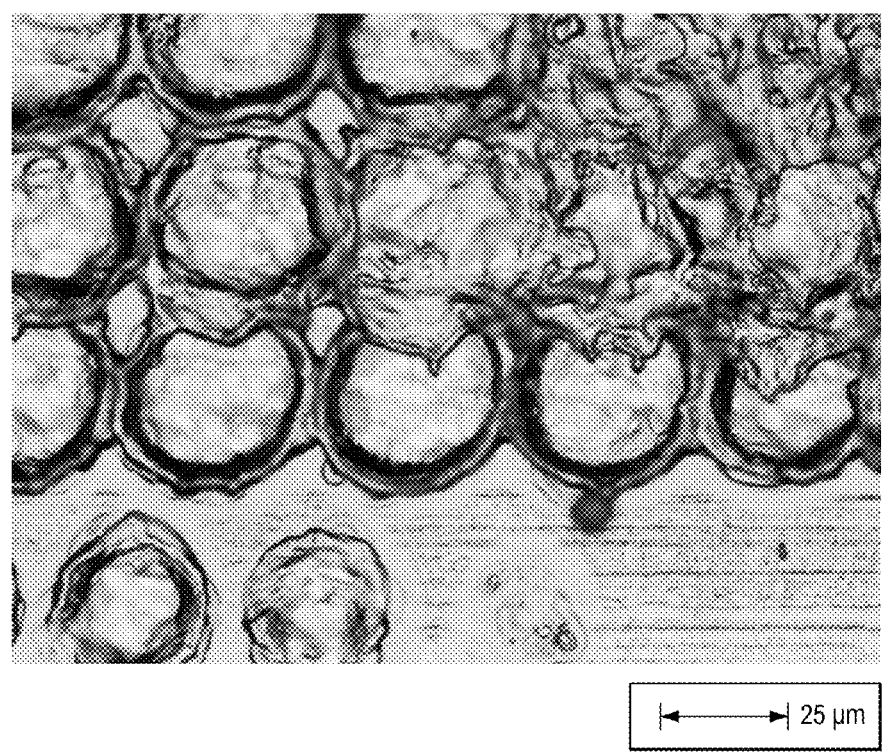
FIG. 5 is an enlarged microphotograph of a portion of the two-dimensional array of surface spots created by the invention.
Figure 6:
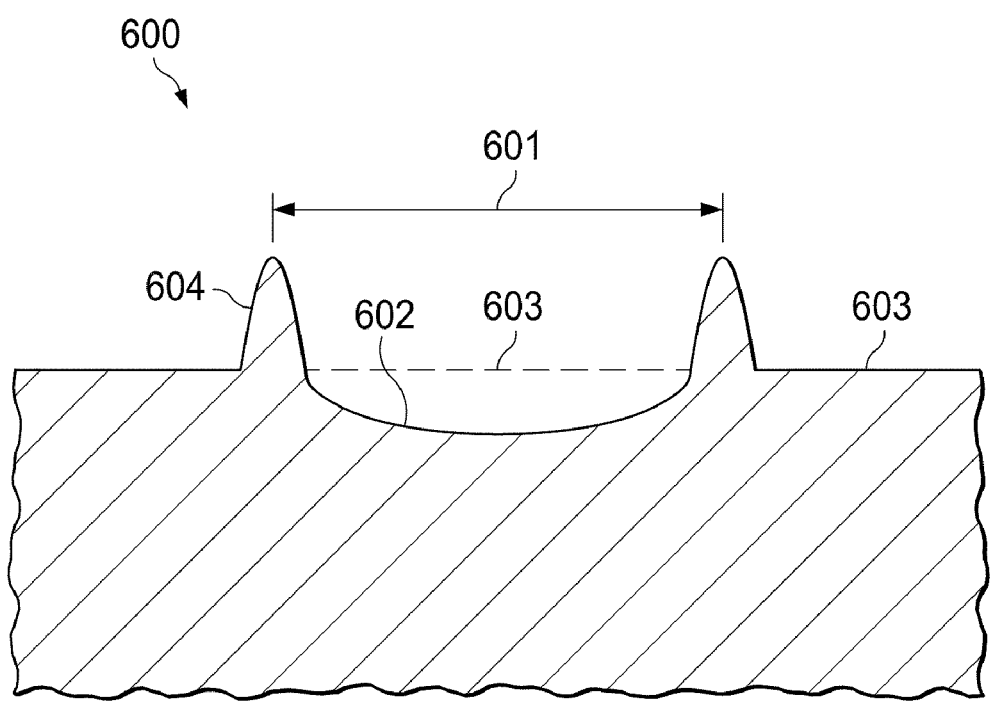
FIG. 6 is a schematic cross section of one surface spot created by the invention.

At still higher magnification, a top view photograph of a portion of a spot array is reproduced in the exemplary FIG. 5, and a schematic cross section of a single spot, generally designated 600, is shown in FIG. 6. The spots in FIG. 5 have an approximately circular outline with a diameter of about 20 to 30 µm and a pitch of less than 50 µm center-to-center; the spots are positioned in an orderly array in x- and y-directions with the rows and lines having a pitch of less than 50 µm. As FIG. 6 depicts, each spot includes an approximately circular central area with diameter 601 and a substantially dish-shaped outline 602 below the original surface 603 with an approximately circular ring 604 of piled-up metal around the central area. In FIG. 5, the spots are so tightly packed that adjacent rings are touching.

Another embodiment of the invention is a carrier made of an insulating compound integral with conductive traces and vias, wherein a molded package is affixed to the compound. As an example, the carrier may be a polymer film, for instance made of polyimide, with conductive traces and vias as used by semiconductor devices; attached to the film is a molded package, which encapsulates the chip. Another example is a substrate made of glass fiber-enforced polymer compound integral with conductive traces and vias, as used for boards in electronic systems.

Referring now to FIGS. 2 and 1, the flexibility of the invention permits to select diverse regions of the leadframe or any other substrate to undergo roughening of the regional surfaces; the roughened surfaces, in turn, enable and strengthen the adhesion of the leadframe or substrate to another object made of a material capable to follow the contours of the roughened surface, such as the polymer compounds used for forming plastic packages of semiconductor devices. The regions designated 114 in FIGS. 2 and 1 serve the adhesion of the package molding compound 130 to the segments 111; in the examples depicted, regions 114 are 750 µm wide. The regions designated 113 in FIGS. 2 and 1 serve the adhesion of the package molding compound 130 to the chip pad 110; in the example depicted, regions 113 are 250 µm wide. The region designated 210 in FIG. 2 serves the adhesion of the chip attach compound 102 to the chip pad 110. The distribution and the size of the roughened surface regions can be fully customized; in particular, it can be tailor-made for any leadframe/substrate shape and surface condition (such as plated surface, or metallic and plastic surface).

Another embodiment of the invention is a method for roughening the original surface of a carrier such as metallic leadframe and an insulating substrate. A laser is selected, such as a ruby laser, a neodymium glass laser, or a fiber laser (capacitive discharge flash lamp) which converts input power (under 10 W) into narrow, intense, pulsed beams of coherent visible or infrared light (for instance, 1063 nm). Alternatively, the laser beam may shine continuously. The power of the laser is selected so that the selected regions of a leadframe can be roughened (by heating, removing and re-depositing the metal atoms of the selected surface area) in a short amount of time suitable for mass production; for instance, the areas of the leadframe in FIG. 2 should be roughened in less than 1 s. As an example, the selected laser should roughen the plurality of regions 114 in FIG. 2 in about 0.70 to 0.75 s, the sum of regions 114 and region 210 in about 0.80 s, and the sum of regions 114, region 210 and region 113 in 0.95 to 1.00 s. Whole strips of leadframes can be roughened in 25 s.

The laser beams are directed on regions of the original carrier surface. By heating, evaporating, and re-depositing atoms of the material in the affected regions, two-dimensional arrays of spots are formed, which consist of a central area below the original surface and a piled ring of amorphous material above the original surface. The depth of the central dish (for example, 1 to 5 µm) and the height of the peripheral piles (for example, 5 to 8 µm) depend on laser parameters such as the intensity and time duration of the laser irradiation. The repetitive sequence of pits and hillocks results in a roughening of the surface so that attached materials such a plastic molding compound, which can adjust to these contours, become locked into the roughened surface. When the carrier is a leadframe with a base metal and protective metal layers on the surface, the roughening may reach through the layer stack and even expose the base metal.

The array of spots may be a regular two-dimensional array, which includes substantially linear rows and lines. Modifying the above laser process, elongated grooves can be created across the surface, either in rows or in crossed patterns. In addition, the laser can inscribe the rough surface pattern not only on the top side of the carrier, but also on the bottom side. In the example of a leadframe, the laser may inscribe, if desired, the bottom surface of the inner lead segments and the bottom surface of the chip pad. Further, any portions of the leadframe can be selected for laser roughening, and for any leadframe design. Generally, any substrate type of substrate portion may be roughened.

Alternatively, the laser methodology of the invention may be employed to roughen any pattern into any carrier surface, especially leadframes and substrates. As examples, the spots may have irregular and arbitrary configuration; they may or may not be distributed in arrays; they may cover small or large portions of the carrier surface; they may distributed on surfaces of one plane or more planes, especially on opposite planes of a carrier, or on surfaces of planes at right angles to each other.

In the process flow of semiconductor assembly and packaging, at least portions of the surface roughening of the leadframes can be performed before chip attach, after chip attach, or after wire bond. Furthermore, the laser process can executed by any assembly site and is not restricted to the leadframe supplier; it can be performed on any leadframe base metal and on any plated surface such as nickel-palladium-gold on copper and silver-spot on copper. Since the laser roughening is a dry process, it creates negligible debris and needs not special environmental precautions.

Since the laser technique does not require photomasks or mask alignments, and does not involve chemicals and clean-up steps, the laser process of the invention is low cost. It was mentioned above that the laser process is fast and that it can be performed at various fabrication sites.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any material for the carrier; when the carrier material is a semiconductor, it may include silicon, silicon germanium, gallium arsenide, or any other semiconductor or compound material used in integrated circuit manufacturing. Further, the semiconductor carrier may include an integrated circuit, a discrete device, or passive components.

As another example, surface roughening by laser technology can be applied to very small-area surfaces. The invention is thus applicable to micro-electro-mechanical devices (MEMS) in order to enhance the adhesion of incompatible materials, especially to MEMS devices with quasi-hermetic packages. An example is a MEMS device using a bulged foil to encapsulate the active component. The advantages of the invention in terms of high speed, low cost, and independence of manufacturing site come also full to bear.

It is therefore intended that the appended claims encompass any such modifications or embodiments.

I claim:

1. An apparatus comprising:
a lead frame having a chip pad and lead segments and arrays of spots on the chip pad and the lead segments, each spot comprising a circular recessed portion and a piled ring of metallic material above and around the recessed portion.

2. The apparatus of claim 1 wherein the spots expose a base metal.

3. The apparatus of claim 2 wherein the array of spots is a regular two-dimensional array including substantially linear rows and lines.

4. The apparatus of claim 3 wherein the diameter of a spot is about 20 to 30 μm.

5. The apparatus of claim 4 wherein the pitch of the spots is less than 50 μm center-to-center, and the pitch of the rows is less than 50 μm centerline-to-centerline.

6. The apparatus of claim 1 further including a semiconductor chip assembled on the chip pad, electrically connected to the lead segments.

7. An apparatus, comprising:
a semiconductor chip affixed on a lead frame;
a mold compound encapsulating the semiconductor chip;
lead segments exposed from the encapsulation at edges of the apparatus;
arrays of spots on the lead segments near where the lead segments are exposed from the encapsulation; and
each spot comprising a circular recessed portion and a piled ring of metallic material above and around the recessed portion.

8. The apparatus of claim 7, further comprising bond wires connecting the semiconductor chip with wire balls to the lead segments with wire stitches.

9. The apparatus of claim 8, in which the spots on each lead segment are between the exposed portion of the lead segment and the wire stitch.

10. The apparatus of claim 7, in which the semiconductor is affixed on a chip pad portion of the lead frame.

11. The apparatus of claim 10, further comprising spots on the chip pad.

12. The apparatus of claim 7, in which the spots are arranged in an array including rows and lines.

13. The apparatus of claim 12, in which the pitch of the spots is less than 50 μm center-to-center.

14. The apparatus of claim 7, in which the diameter of a spot is about 20 to 30 μm.

15. The apparatus of claim 7, in which the piled ring includes amorphous metal.

* * * * *